(12) United States Patent
Zimmer et al.

(10) Patent No.: US 6,632,127 B1
(45) Date of Patent: Oct. 14, 2003

(54) FIXED ABRASIVE PLANARIZATION PAD CONDITIONER INCORPORATING CHEMICAL VAPOR DEPOSITED POLYCRYSTALLINE DIAMOND AND METHOD FOR MAKING SAME

(76) Inventors: Jerry W. Zimmer, 21260 Glenmount, Saratoga, CA (US) 95070; Todd W. Buley, 7464 E. Keats Ave., Mesa, AZ (US) 85208; Albert B. Stubbmann, 3152 Rambeau Rd., Bethlehem, PA (US) 18020

( * ) Notice: Subject to any disclaimer, the term of this patent is extended or adjusted under 35 U.S.C. 154(b) by 0 days.

(21) Appl. No.: 10/091,105

(22) Filed: Mar. 4, 2002

Related U.S. Application Data
(60) Provisional application No. 60/274,128, filed on Mar. 7, 2001.

(51) Int. Cl.[7] ............................................. B24B 29/00
(52) U.S. Cl. ..................... 451/285; 451/41; 451/286; 451/287; 451/288; 428/408; 428/701; 428/702
(58) Field of Search ..................... 451/41, 285, 286, 451/287, 288; 428/408, 701, 702

(56) References Cited

U.S. PATENT DOCUMENTS

| | | | |
|---|---|---|---|
| 5,186,973 A | 2/1993 | Garg et al. | |
| 5,621,224 A | * 4/1997 | Yamazaki et al. | ............. 257/66 |
| 5,795,653 A | * 8/1998 | Cuomo et al. | ............... 428/408 |
| 5,833,753 A | 11/1998 | Herlinger et al. | |
| 5,921,856 A | 7/1999 | Zimmer | |
| 5,951,372 A | * 9/1999 | Choquette et al. | ............. 451/38 |
| 5,997,650 A | 12/1999 | Herlinger et al. | |
| 6,054,183 A | 4/2000 | Zimmer et al. | |
| 6,242,356 B1 | * 6/2001 | Jang et al. | .................. 438/699 |

* cited by examiner

*Primary Examiner*—Joseph J. Hail, III
*Assistant Examiner*—Shantese McDonald
(74) *Attorney, Agent, or Firm*—Dean W. Russell; Bruce D. Gray; Kilpatrick Stockton LLP

(57) ABSTRACT

The present invention is a polishing pad conditioning head for a CMP and similar types of apparatus that is especially useful in conditioning the surface of fixed-abrasive CMP polishing pads to maintain optimal process conditions for the planarization process on dielectric and metal films on semiconductor wafers, as well as wafers and disks used in computer hard disk drives. The polishing pad conditioning head comprises a substrate and a layer of fine-grain chemical vapor deposited polycrystalline diamond that is bonded onto the substrate. Alternatively, a thin sheet of polycrystalline diamond may be deposited on a preferred growth substrate by a chemical vapor deposition process, then removed from the growth substrate and then bonded to the CMP conditioning disk substrate.

5 Claims, 3 Drawing Sheets

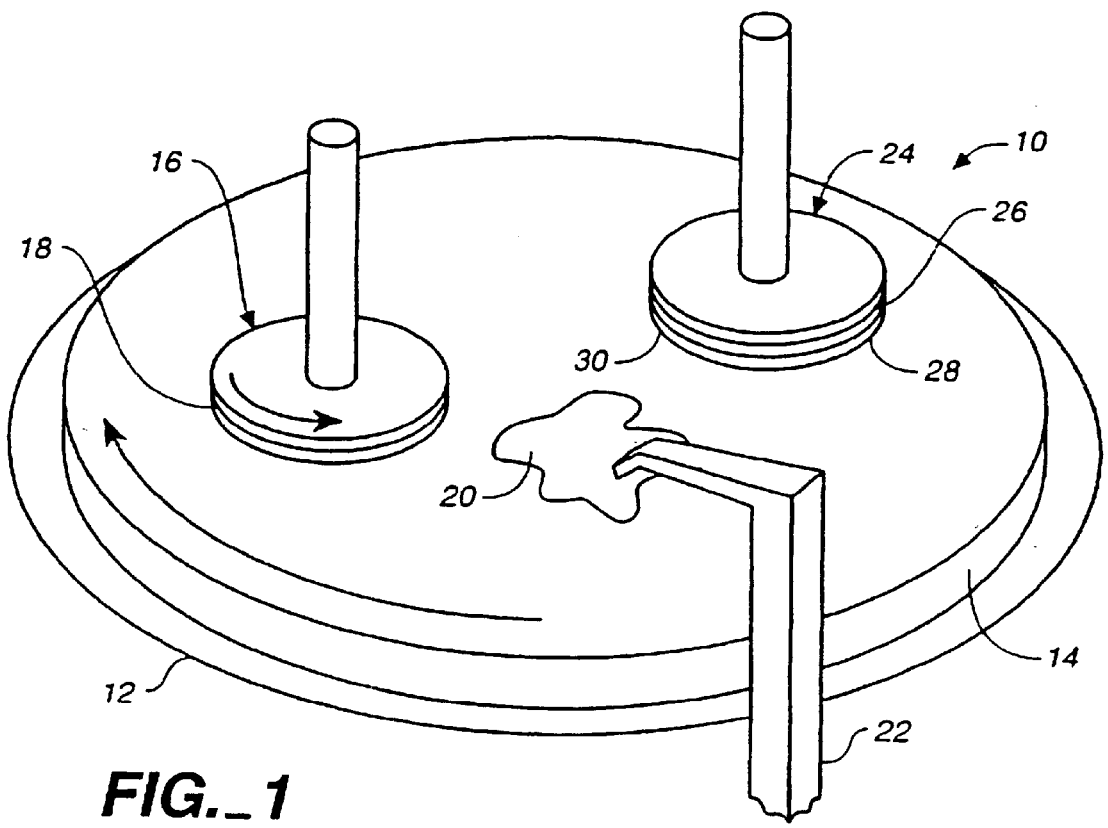
FIG._1

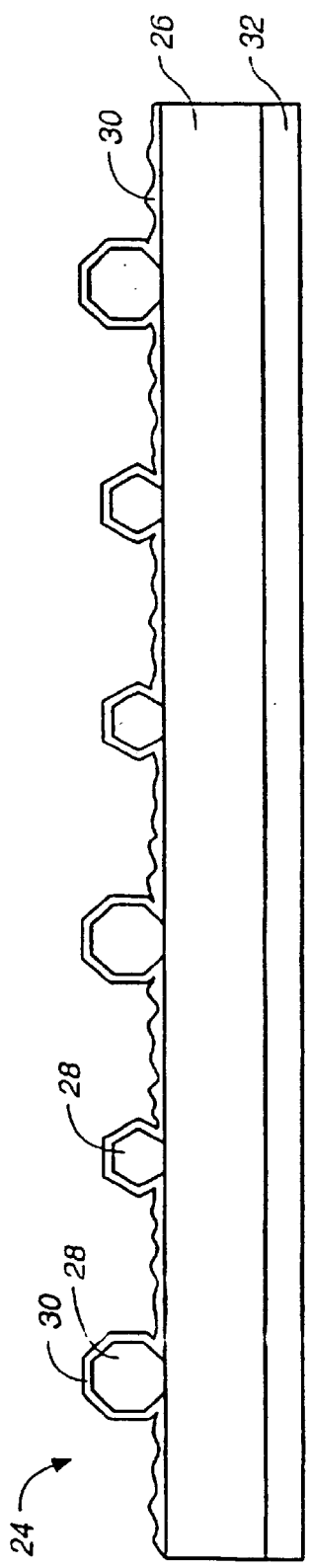
*FIG._2*
(PRIOR ART)
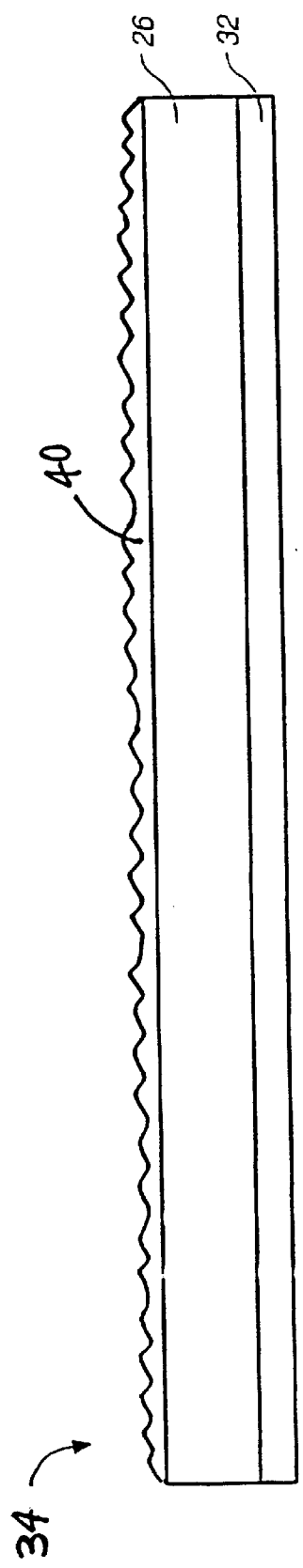
*FIG._3*

FIG._4

FIXED ABRASIVE PLANARIZATION PAD CONDITIONER INCORPORATING CHEMICAL VAPOR DEPOSITED POLYCRYSTALLINE DIAMOND AND METHOD FOR MAKING SAME

This application claims priority to U.S. Provisional Application No. 60/274,128 filed on Mar. 7, 2001, the entire contents of which are incorporated by reference herein.

FIELD OF THE INVENTION

The present invention relates to flat substrate polishing and Chemical-Mechanical-Planarization (CMP) polishing pad conditioning heads or disks. The invention may be used to condition a unique class of CMP polishing pads that incorporate areas of fixed abrasive material on the polishing pad to eliminate the need for abrasive-containing slurries in the polishing of both dielectric and semiconductor (oxide) films and metal films on semiconductor wafers as well as wafers and disks used in computer hard disk drives. More specifically, this invention relates to continuous CVD diamond coated substrates having sufficient surface roughness for use in other abrasive sanding, grinding or polishing tools where very controlled and gentle abrasion is required.

BACKGROUND OF THE INVENTION

CMP has become a critical process employed in the fabrication of high-density integrated circuits, disk drive heads and nano-fabricated components. The CMP process economics are a function of the costs for consumables employed, depreciation and yields. Traditionally slurries represent the largest component of process costs and a major source of yield losses due to the instability of the slurry solution. Other consumables employed in the CMP process include polishing pads, pad conditioners and various mechanical components of the polishing system.

A new class of "fixed abrasive" polishing pads has been developed that integrates abrasive material into the polishing pad, eliminating the need for a separate abrasive-containing slurry. An example of a fixed abrasive CMP pad is the 3M Slurry-Free CMP Pad #M3100, manufactured by 3M Corporation Superabrasives and Microfinishing Systems Division, consisting of a polymer pad with 40-micron tall×200-micron diameter pedestals comprised of 0.2-micron cerium oxide abrasive. The CMP polishing rate resulting from the use of these fixed abrasive pads is highly sensitive to the surface properties of the abrasive (e.g. cerium oxide) areas on the pads. The first application of these pads was for a particular type of integrated circuit, Dynamic Random Access Memory chips (DRAMs). It has been found that the surface roughness and hardness of the DRAMs actually conditions the fixed abrasive material until the polishing process is completed. This establishes a process that is self-limiting, minimizing the potential for "overpolishing." In the process, after installing a new fixed abrasive pad, there is known to be a period, i.e. polishing of typically 5 to 20 wafers, during which the quality of polishing is low, and the wafer yield loss is very high due to the required period of pad conditioning, i.e. pad "break-in." Therefore, expensive product wafers are destroyed during this break-in process, which is detrimental to manufacturing economics.

Traditional CMP pad conditioners employ relatively large, abrasive grit, which is bonded to a substrate using electroplated metal or various brazing materials. Additionally, Zimmer, U.S. Pat. No. 5,921,856 and Zimmer et al. U.S. Pat. No. 6,054,183 describe a class of CMP pad conditioners utilizing large, abrasive diamond grit bonded to a substrate with a CVD diamond film. For all of these CMP pad conditioning disk products, the grit particles are too large to effectively condition the surface of the fixed-abrasive polishing pads, and their use results in damage or extreme wear to the pad, short pad lifetimes, and unstable process conditions.

Tietz et al. European Patent Application EP 1 052 062 A1 discloses a method and apparatus for preconditioning fixed abrasive articles that employs an abrasive disk or pad comprised of a material having a surface roughness less than or equal to 0.20 micron, such as silicon carbide, alumina, silica, titania, copper, resist, and polymers. Tietz et al. do not contemplate the use of polycrystalline diamond, or any other chemical vapor deposited coated substrates as the abrasive disk.

The present invention overcomes these problems with prior art CMP pad conditioners, and is especially useful for conditioning fixed-abrasive polishing pads.

The product of the present invention allows fixed-abrasive CMP polishing pads to be preconditioned prior to wafer processing, resulting in minimization of yield losses after a new fixed abrasive pad is installed on a CMP system. The CMP pad conditioner of the present invention also allows wafer-processing yields to be further optimized.

SUMMARY OF THE INVENTION

In contrast to prior art pad conditioners, the conditioner of the present invention does not utilize a low distribution of large grit particles on the conditioner surface. Rather, the conditioner of the present invention is a unique CMP pad conditioner whose conditioning properties are controlled by a polycrystalline diamond surface microstructure. Using a layer of fine, polycrystalline diamond to create the abrasive surface, it is possible to fabricate the abrasive geometry needed to establish and maintain optimal polishing conditions for fixed-abrasive polishing pads. The surface hardness, crystalline orientation and average crystal dimensions control the properties of the conditioner such as the conditioning rate. The CMP process rate, pad lifetimes and process yields are optimized by controlling the surface microstructure of the conditioner in the present invention.

The present invention is directed to a polishing pad conditioning head for a CMP and similar types of apparatus that has been found especially useful in conditioning the surface of fixed abrasives in fixed-abrasive CMP polishing pads in the manner necessary for maintaining optimal process conditions for the planarization process on dielectric and metal films on semiconductor wafers, as well as wafers and disks used in computer hard disk drives.

In a CMP and similar apparatus, a polishing pad conditioning head is provided which comprises a substrate and a layer of polycrystalline diamond that is attached onto the substrate. Preferably, the polycrystalline diamond with a fine and controlled grain structure is deposited directly onto the substrate by chemical vapor deposition (CVD). By the term of "chemical vapor deposition," it is intended to mean deposition of materials by vacuum deposition processes, including thermally-activated deposition from reactive gaseous precursor materials; and plasma, microwave plasma, and DC or RF plasma arc-jet deposition from gaseous precursor materials. Alternatively, a thin sheet of polycrystalline material may be deposited on a preferred growth substrate by a chemical vapor deposition process, then removed from the growth substrate and bonded to the CMP conditioning disk substrate by a variety of attachment or lamination methods known in the art. In contrast to other materials disclosed in the prior art, CVD diamond exhibits the highest hardness, extremely low chemical reactivity, and can be deposited with a highly controlled microstructure.

BRIEF DESCRIPTION OF DRAWINGS

FIG. 1 illustrates one type of CMP apparatus incorporating a fixed abrasive polishing pad in accordance with the present invention;

FIG. 2 illustrates a diagrammatic cross-sectional view of a polishing pad conditioning head in accordance with the prior art;

FIG. 3 illustrates a diagrammatic cross-sectional view of a polishing pad conditioning head in accordance with one embodiment of the present invention;

FIG. 4 illustrates a representative microstructure of a CVD diamond-coated silicon polishing pad conditioning head in accordance with one embodiment of the present invention.

DESCRIPTION OF THE PREFERRED EMBODIMENTS OF THE INVENTION

A representative CMP apparatus 10 illustrated in FIG. 1 contains platen 12 with polishing pad 14 securely fastened thereto. Polishing pad 14 containing a fixed abrasive is shown rotating, for example, in a clockwise direction. Semiconductor wafer holder 16 with wafer 18 is positioned as shown to urge and maintain wafer 18 against the exposed surface of pad 14. Holder 16 is shown rotating, for example, in a counterclockwise direction. Wafer 18 is secured to holder 16 by means of a vacuum or other means well known in the art. Liquid polishing solution 20, e.g. water or pH adjusted water is dispensed within the center region of pad 14 through the nozzle of conduit 22. The exact composition of the polishing solution is closely calculated to provide the desired planarization of the exposed surface of the wafer. Although apparatus 10 shows only one wafer holder, CMP equipment is commercially available that includes multiple holders.

In the prior art conditioning disk of Zimmer, U.S. Pat. No. 5,921,856, illustrated in FIG. 2, disk 24 comprises substrate 26, natural or synthetic diamond grit 28 evenly distributed over the surface of substrate 26 and a continuous thin film 30 of CVD polycrystalline diamond (hereinafter referred to as "CVD diamond") grown onto grit 28 and substrate 26 so that grit 28 is encased in CVD diamond 30 and bonded to the surface of substrate 26. Substrate 26 is shown bonded to optional backing plate 32. During testing of this product with fixed abrasive conditioning pads, it was found that the grit particles 28 produced damage or extreme wear of the pad, short pad lifetimes, and unstable CMP process conditions.

In has been surprisingly found that the conditioning disk of the present invention, illustrated in FIG. 3, produces outstanding conditioning results with fixed-abrasive polishing pads. In one embodiment of the product of the present invention, illustrated in FIG. 3, disk 24 comprises substrate 26, and a continuous thin film of CVD polycrystalline diamond 40 grown onto and attached to the surface of substrate 26. Substrate 26 is shown bonded to optional backing plate 32.

In one embodiment of the present invention, a uniform layer 30 of CVD diamond is grown onto the exposed surface of substrate 26 using a hot filament CVD (HFCVD) reactor of the type described and claimed in Garg, el al., U.S. Pat. No. 5,186,973, issued Feb. 16, 1993; the portions relevant to growing CVD diamond onto substrates are incorporated by reference herein.

The HFCVD process for diamond involves activating a feed gaseous mixture containing a mixture of a hydrocarbon and hydrogen by heated filament and flowing the activated gaseous mixture over a heated substrate to deposit the polycrystalline diamond film. The feed gas mixture, containing from 0.1 to about 10% hydrocarbon in hydrogen, is thermally activated under sub-atmosphere pressure, i.e. no greater than about 100 Torr, to produce hydrocarbon radicals and atomic hydrogen by using a heated filament made of W, Ta, Mo, Re or a mixture thereof. The filament temperature ranges from about 1800° C. to 2800° C. The substrate is heated to a deposition temperature in the range of about 600° C. to about 1100° C.

Preferably, the CVD diamond is chemically vapor deposited onto the surface of the substrate such that the CVD diamond layer exhibits enhanced crystal orientation in either the (220) or the (311) direction and the (400) direction over that of industrial grade of diamonds. The phrase "chemically vapor deposited" is intended to mean the deposition of a layer of CVD diamond resulting from the decomposition of a feed gas mixture of hydrogen and carbon compounds, preferably hydrocarbons, into diamond generating carbon atoms from a gas phase activated in such a way as to avoid substantially graphitic carbon deposition. The concentration of carbon compounds in the hydrogen gas can vary from about 0.01% to about 10%, preferably from about 0.2 to about 5%. The resulting diamond film in the HFCVD deposition method is in the form of adherent individual crystallites or a layer-like agglomerates of crystallites substantially free from intercrystalline adhesion binder.

The total thickness of the CVD diamond thin film is preferably in the range of about 10 to 50 microns. Still more preferably, it is about 15 to 30 microns.

The peak-to-valley surface roughness resulting from growing CVD diamond on a smooth substrate is typically in the range of about 10–20% of the total thickness of the CVD diamond layer. This degree of surface roughness has been found to provide the desired abrasive efficiency for CMP conditioning operations on fixed-abrasive CMP pads.

Substrate 26 comprises any material known to allow the growth of CVD diamond and includes such materials as silicon, silicon carbide, silicon nitride, sintered tungsten carbide, tungsten carbide, tungsten, molybdenum and similar materials or any material coated with the previous materials. The substrate is usually in the form of a disk ranging in diameter from about 2 to 4 inches. However, other shapes may be used as the substrate for conditioning heads. The thickness of substrate 26 ranges from about 0.02 to about 0.5 inch, preferably 0.04 to 0.15 inch.

In the case of silicon substrates, the silicon is often bonded to backing plate 32 using well-known adhesives to give conditioning disk 34 greater mechanical stability. Typically, backing plate 32 comprises nickel plated magnetic steel or stainless steel having a thickness of about 0.04 to 0.08 inch.

FIG. 4 shows a representative plane view scanning electron microscope (SEM) image of an example of disk 34 of the present invention, in which the CVD diamond film was deposited to a thickness of approximately 10 to 15 microns on a silicon disk substrate. Excellent results have been obtained with diamond films of this thickness range, exhibiting the microstructure shown in FIG. 4.

One of the key advantages of the present invention over prior art products is that the thickness, microstructure and surface roughness of the CVD polycrystalline diamond layer may be optimized by control of the CVD deposition process parameters to produce a product with optimum polishing characteristics. The chemical vapor deposition process of the present invention allows the average roughness, RMS roughness and peak-to-valley roughness of the deposited polycrystalline diamond to be controlled via the appropriate choice of the deposited material thickness and deposition conditions such as gas flow rate and substrate temperature.

EXAMPLE

The example that follows further illustrates one embodiment of the conditioning head of the present invention. The example is for illustrative purposes and is not meant to limit the scope of the claims in any way.

Example 1

A two-inch diameter silicon substrate having a thickness of 0.04 inch (~1 mm) was placed flat on a support fixture of an HFCVD reactor of the type described and claimed in the above-referenced Garg, et al., U.S. Pat. No. 5,186,973, as modified in accordance with the teachings of Herlinger, et al., U.S. Ser. No. 08/575,763.

The substrate was then placed in the CVD diamond deposition reactor. The reactor was closed, evacuated and 15.95 kW (145 volts and 110 amps) were supplied to heat the filament to about 2000° C. A mixture of 72 sccm (standard cubic centimeters per minute) of methane in 3.0 slpm (standard liters per minute) of hydrogen was fed into the reactor for a period of 1 hour and minutes at a pressure of 30 Torr to deposit about 1–2 microns of polycrystalline diamond onto the exposed surface of the silicon substrate. Next, the power was increased to 21.24 kW (177–187 volts and 120 amps) at a pressure of 25 Torr for an additional 36 hours and 30 minutes. Then, the filament power was turned off and the coated wafer was cooled to room temperature under flowing hydrogen gas. A total of 10–15 microns of coherent polycrystalline CVD diamond was deposited onto the previously deposited CVD diamond layer. The second side of the disk from the latter step was bonded to a backing layer as illustrated in FIG. 3.

FIG. 4 presents a 3000×magnification scanning electron microscope (SEM) image of the surface of the diamond film. The film is believed to exhibit enhanced crystal orientation in the (220) direction over that of industrial grade diamonds. The topography was measured using a Tencor P10 surface profilometer with a 12.5-micron radius diamond stylus, a load of 10 mg and a scan speed setting of 20. Five scans, each 1 mm long, were made at different locations on the diamond surface. Average roughness (Ra), RMS roughness (Rq), and peak-to-valley roughness (Rt) were measured in each location, and the five readings were averaged. The average values obtained for the diamond surface presented in FIG. 4 were Ra=0.21 micron; Rq=0.29 micron; Rt=1.8 microns. It is probable that vertical microscope measurements would result in larger values of Ra, Rq and Rt, since the tip diameter of the profilometer is too large to reach the bottom of the valleys between individual diamond crystallites. The morphology of the CVD diamond surface in can also be described by the density of diamond peaks. In the case of the CVD diamond surface shown in FIG. 4, the density of peaks is about 120,000 per square millimeter of surface area, corresponding to an average peak-to-peak spacing of approximately 3 microns.

The resulting conditioning head 34 was mounted and testing on a rotary platform. Conditioning system was setup to use standard pressure ranges from 2 to 8 pounds, and a sweep profile of 1 second per segment for 10 segments across the pad radius. Rotational speeds of 60 rpm for platen 14 and 50 rpm for conditioning head 34. A total of 100 sweeps were processed for each sample. The fixed abrasive material was then inspected for damage using optical microscope and surface profilometry.

The results unexpectedly indicated that no detectible surface damage and the erosion rate of the fixed abrasive material could be controlled. In contrast, the conditioning disks of Zimmer, U.S. Pat. No. 5,921,856 with diamond grit size of 35 microns and 50 microns were tested and found to produce poor results when conditioning 3M Slurry-Free CMP Pad#M3100. The poor results were in the form of damage to the fixed abrasive material. Many of the micro-replicated posts were completely removed from the polyester backing films, and others were broken apart. The resulting damage rendered the fixed abrasive material useless for semiconductor wafer polishing. The designed bearing area was altered, and the fixed abrasive material no longer exhibited a uniform surface for polishing. It is known in the art that these types of damage to fixed abrasive pads result in increased defect density on wafer substrates during CMP and wafer-to-wafer polishing rate instability.

It is believed that the enhanced (220) crystal orientation of the diamond film in FIG. 4 with respect to industrial grade diamonds is an important factor for optimizing the performance of the present invention. It is also believed that the surface microstructure of the CVD diamond disk in Example 1 may effectively mimic the surface structure of DRAM chips in terms of the ability to condition the fixed-abrasive CMP pads on the microscopic scale. The present invention allows extension of the useful life of the fixed abrasive material as well as elimination of the need to use expensive semiconductor test wafers to prepare the surface prior to polishing semiconductor product wafers.

What is claimed is:

1. A gritless polishing pad conditioning head, comprising a silicon substrate and a conditioning surface of chemical vapor deposited polycrystalline diamond bonded directly to said substrate, without encased or bonded particles of grit.

2. The conditioning head of claim 1, wherein said conditioning surface of chemical vapor deposited polycrystalline diamond has a fine and controlled grain microstructure.

3. The conditioning head of claim 2, wherein the total thickness of said conditioning surface of chemical vapor deposited polycrystalline diamond is in the range of about 10 to 50 microns, and the peak-to-valley surface roughness of said conditioning surface is in the range of about 10 to about 20% of the total thickness of said chemical vapor deposited polycrystalline diamond.

4. The conditioning head of claim 3, wherein the total thickness of said conditioning surface of chemical vapor deposited polycrystalline diamond is in the range of about 10 to 30 microns.

5. The conditioning head of claim 1, wherein conditioning head is suitable for conditioning a fixed abrasive polishing pad.

* * * * *